(12) United States Patent
Whitney et al.

(10) Patent No.: US 10,651,852 B1
(45) Date of Patent: May 12, 2020

(54) REVERSE DIRECTION HIGH-ELECTRON-MOBILITY LOGIC GATE

(71) Applicants: David L. Whitney, Saratoga, CA (US); Manuel M. Del Arroz, Diablo, CA (US)

(72) Inventors: David L. Whitney, Saratoga, CA (US); Manuel M. Del Arroz, Diablo, CA (US)

( * ) Notice: Subject to any disclaimer, the term of this patent is extended or adjusted under 35 U.S.C. 154(b) by 0 days.

(21) Appl. No.: 16/659,176

(22) Filed: Oct. 21, 2019

Related U.S. Application Data

(60) Provisional application No. 62/749,017, filed on Oct. 22, 2018.

(51) Int. Cl.
*H03K 19/094* (2006.01)
*H03K 19/20* (2006.01)

(52) U.S. Cl.
CPC ........... *H03K 19/094* (2013.01); *H03K 19/20* (2013.01)

(58) Field of Classification Search
CPC ............................ H03K 19/094; H03K 19/20
See application file for complete search history.

(56) References Cited

U.S. PATENT DOCUMENTS

| 4,931,669 A | * | 6/1990 | Higashisaka | .... H03K 19/01721 326/117 |
| 6,201,416 B1 | * | 3/2001 | Numata | ............. H03K 19/0013 326/107 |

* cited by examiner

*Primary Examiner* — Daniel D Chang
(74) *Attorney, Agent, or Firm* — Douglas L. Weller

(57) ABSTRACT

A logic gate includes at least one reverse direction high-electron-mobility transistor. The reverse direction high-electron-mobility transistor includes at least one source connected to a first reference voltage, at least one gate connected to an output, and at least one drain connected to the output. Logic implementing circuitry is connected between the output an additional reference voltage. The logic implementing circuitry includes a first transistor that includes a gate connected to a first input, and a second transistor that includes a gate connected to a second input.

17 Claims, 14 Drawing Sheets

REVERSE DIRECTION HIGH-ELECTRON-MOBILITY LOGIC GATE

BACKGROUND

A metal-oxide-semiconductor field-effect transistor (MOSFET) uses an insulated gate to control current flow between a source and a drain of the MOSFET. Current Voltage characteristics of a conventional MOSFET are shown in FIG. 1. In FIG. 1, the horizontal axis represents voltage from the drain to the source (Vds). The vertical axis represents current values flow from the drain to the source (Ids). As long as the MOSFET is forward biased (Vds is positive), the gate-to-source voltage (Vgs)—sometimes called gate voltage Vg—controls current flow (Ids) through the MOSFET. The threshold voltage (Vth) is the minimum value of Vgs that is needed to create a conducting path between the source and the drain. As illustrated in FIG. 1, increasing the gate voltage above the threshold voltage results in increased conductivity.

When the MOSFET is negative biased (Vds is negative), the gate-to-source voltage (Vg) has less impact on current flow through the MOSFET. This is the result of a body diode intrinsic within FETs which allows current flow from source to drain regardless of the gate voltage. For example, in an n-channel MOSFET, the source and the drain are n+ regions and the body is a p region. The p-n junction formed at the intersection of the p body and the n+ regions act as a diode between the body and the source of the MOSFET and between the body and the drain of the MOSFET. Because in a MOSFET the source is typically shorted to the body, the body diode between the body and the source is irrelevant. However, the body diode to the drain allows a current path from the body to the drain when the MOSFET is negative biased (Vds is negative).

DETAILED DESCRIPTION

A high-electron-mobility transistor (HEMT) also known as a heterostructure FET (HFET) is a field-effect transistor incorporating a junction between two materials with different band gaps at the channel instead of a doped region. In a Gallium Arsenide (GaAs) HEMT, a depleted Aluminum Gallium Arsenide (AlGaAs) layer is placed over a non-doped narrow-bandgap channel layer of GaAs. The electrons generated in the thin n-type AlGaAs layer drop into the GaAs layer to form a depleted AlGaAs layer. The heterojunction created by different band-gap materials forms a quantum well in the conduction band on the GaAs side where the electrons can move quickly without colliding with any impurities. This creates a very thin layer of highly mobile conducting electrons with very high concentration, giving the channel very low resistivity. Other materials can be used to form a HEMT such as in a Gallium Nitride HEMT. GaN-based HEMTs have a similar layered structure where no intentional doping is required. In AlGaN/GaN HEMTs, electrons form a high carrier concentration at the interface, which leads to a two-dimensional electron gas (2DEG) channel due to the spontaneous polarization found in wurtzite-structured GaN. The 2DEG is a function of AlGaN thickness and the bound positive charge at the interface. AlGaN/GaN HEMTs providing high power density and breakdown voltage can be achieved. The polarization effect between the GaN channel layer and AlGaN barrier layer causes a sheet of uncompensated charge in the order of 0.01-0.03 Coulombs per meter (C/m) to form. If the 2DEG is continuous between source and drain the transistor will be normally "on" or depletion HEMT (dHEMT) turning "off" with a negative gate bias. With the addition of Mg doping or other techniques to compensate the built in charge under the gate, the 2DEG is not continuous at zero gate bias. This will achieve a normally off or enhancement mode behavior characteristic of an enhancement HEMT (eHEMT).

Additional eHEMT devices of interest are Indium Phosphate (InP) based HEMTs due to their high electron mobility, high electron saturation velocity, and high electron concentration. These devices are made of an InGaAs/InAlAs composite cap layer, an undoped InAlAs Schottky barrier and an InGaAs/InAs composite channel for superior electron transport properties.

Figure 1:
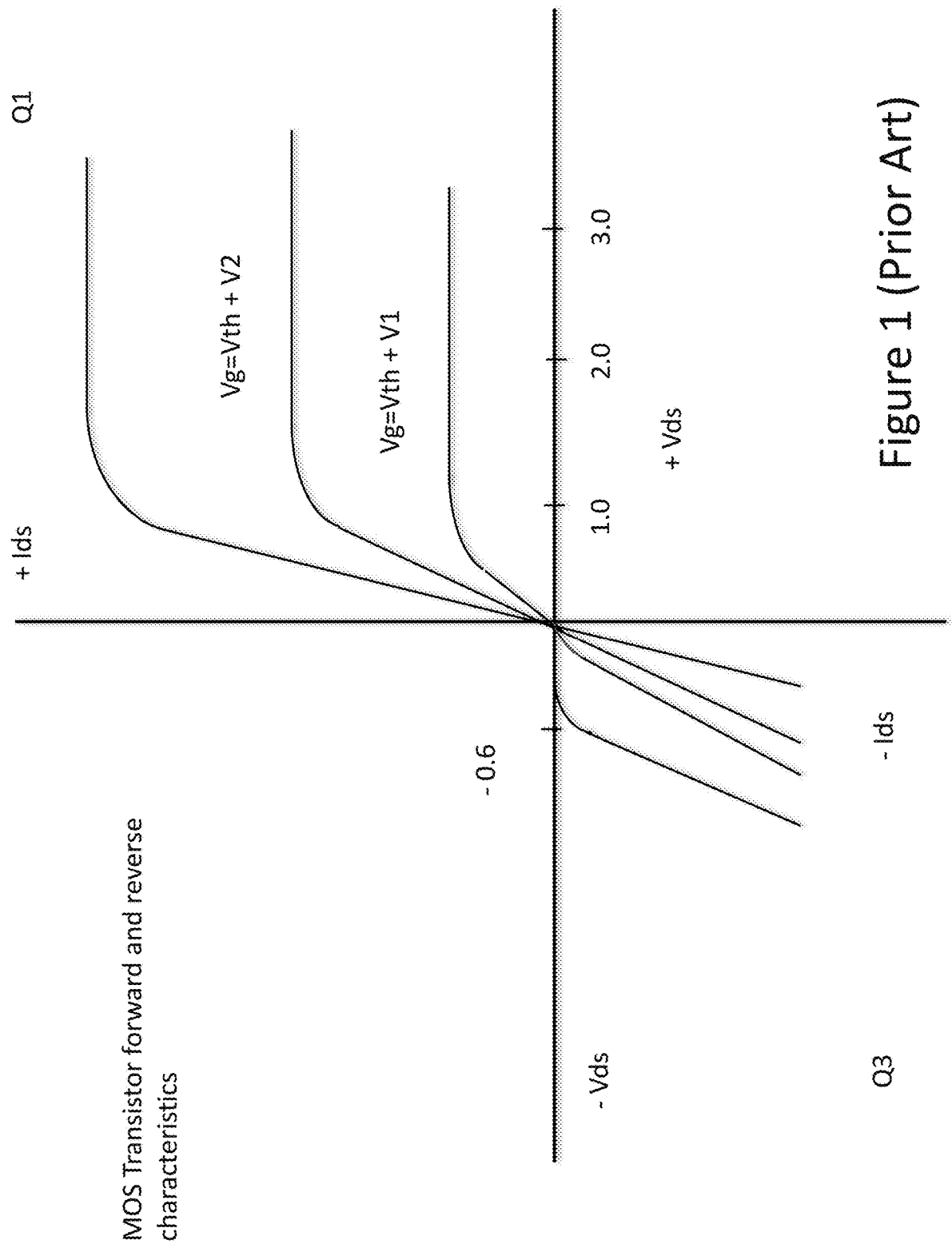
FIG. 1 shows current characteristics of a typical metal-oxide-semiconductor field-effect transistor (MOSFET) in accordance with the prior art.
Figure 2:
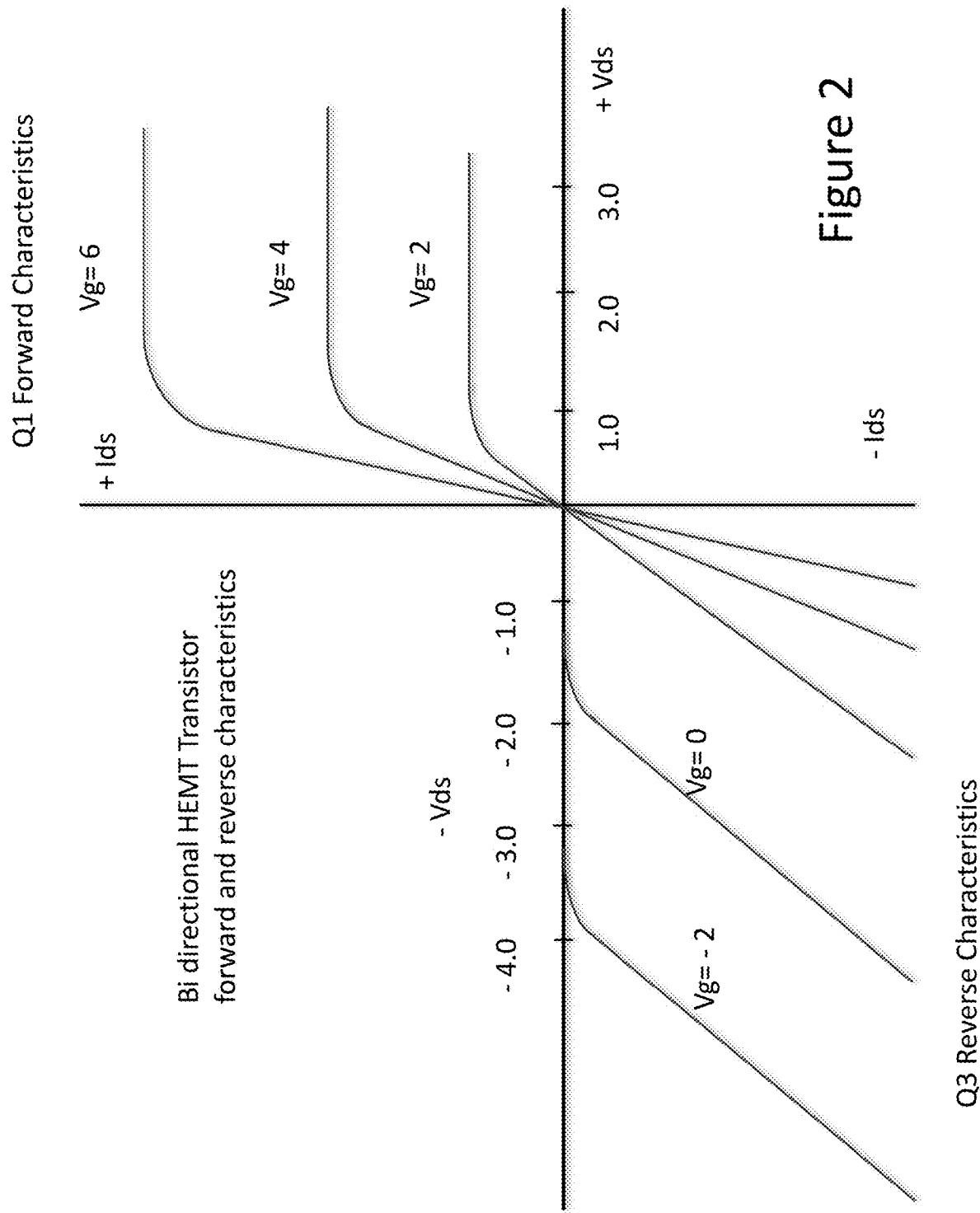
FIG. 2 shows current characteristics of a high-electron-mobility transistor (HEMT).

Since there is no p-n junction within an HEMT, there is no p-n body diode formed. This results in significantly different voltage characteristics between a HEMT and a MOSFET. For example, FIG. 2 shows current voltage characteristics of a HEMT. In FIG. 2, the horizontal axis represents voltage from the drain to the source (Vds). The vertical axis represents current values flow from the drain to the source (Ids). HEMT transistor current-voltage characteristics in the forward direction look similar to PN junction technologies like MOSFETs. That is, as long as the HEMT is forward biased (Vds is positive), the gate-to-source voltage (Vgs) controls current flow (Ids) through the HEMT.

The reverse conduction characteristics of a reverse direction HEMT (RDHEMT) are different than the reverse conduction characteristics of MOSFETS because in HEMTs there is no p-n body diode formed. In addition to the ability to block reverse voltages above the typical 0.6 volts of forward biased silicon PN junctions, some HEMT transistors turn on in the reverse direction with a negative voltage on the drain relative to the source (−Vds) primarily due to charge injection into the enhancement mode channel. This category of HEMT transistors have reverse conduction characteristics that differ from their forward conduction characteristics in both cause and form.

For example, Gallium nitride HEMTs are an example of HEMT transistors that have a reverse conduction mode and have attracted attention due to their high-power and high frequency performance. In the reverse direction, such an RDHEMT device starts to conduct when the absolute value of the negative drain voltage with respect to the source voltage I −Vds I is greater than the gate threshold voltage. The RDHEMT then exhibits a channel resistance and conducts current. If a negative gate voltage is applied with respect to the source voltage, the negative drain to source voltage must be increased for the RDHEMT to conduct current.

Figure 3:
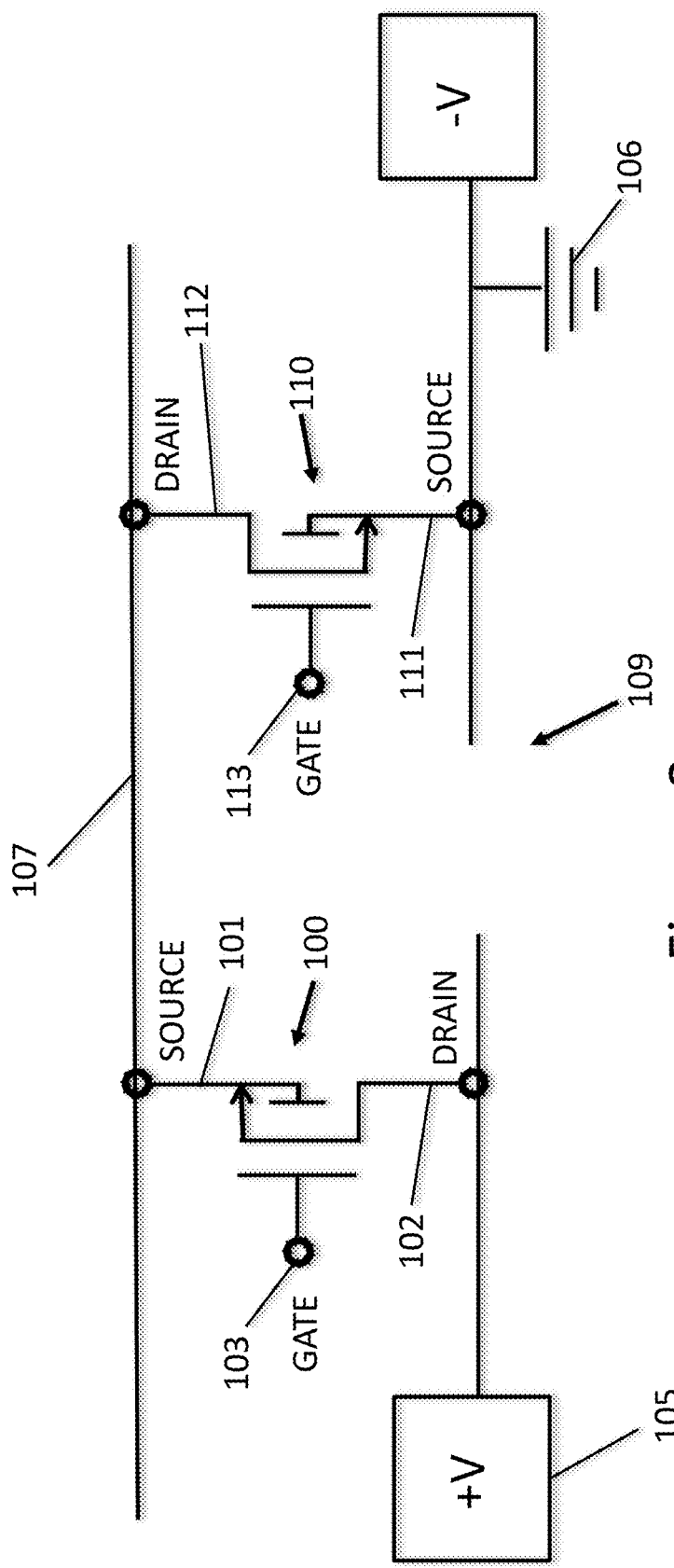
FIG. 3 is a simplified circuit diagram of a voltage clamping circuit.

FIG. 3 is a simplified circuit diagram of a voltage clamping circuit 109 used to clamp voltage excursions by using RDHEMT operation in the reverse direction.

An RDHEMT 100 has a source 101, a drain 102 and a gate 103. An RDHEMT 110 has a source 111, a drain 112 and a gate 113. Source 111 and gate 113 of RDHEMT 110 are connected to a reference voltage 106 (−V). Drain 102 of RDHEMT 100 is connected to a reference voltage 105 (+V). Source 101 and gate 103 of RDHEMT 100 and drain 112 of RDHEMT 110 are all connected to a line 107 that is voltage clamped.

Because source 101 and gate 103 of RDHEMT 100 are connected to line 107, line 107 is voltage clamped from being significantly more positive than reference voltage reference voltage +V. When the voltage on line 107 is increased to be much greater than reference voltage +V, the drain to source voltage or Vds of RDHEMT 100 will decrease and go negative. As the voltage on line 107 continues to increase, the magnitude of the negative drain to source voltage of RDHEMT 100 will continue to increase until RDHEMT 100 begins to conduct current in the reverse direction from line 107 through to reference voltage 105 (+V), resulting in a voltage clamping effect on line 107.

The operating characteristics of RDHEMT 100 are illustrated in FIG. 2 as seen for the case where Vgs=0. When Vgs=0 and Vds is greater than −1.6 volts, there is no current flow through RDHEMT 100. When Vgs=0 and Vds is less than −1.6 volts, there is a reverse current flow through RDHEMT 100. This current flow at the voltage threshold of −1.6 volts is what allows RDHEMT 100 to clamp the voltage on line 107 beginning where the voltage on line 107 is 1.6 volts more than V+.

Because drain 112 of RDHEMT 110 is connected to line 107, line 107 is voltage clamped from being significantly more negative than reference voltage −V from reference voltage 106. When the voltage on line 107 is decreased to be much less than reference voltage −V, the drain to source voltage or Vds of RDHEMT 110 will decrease and go negative. As the voltage on line 107 continues to decrease, the magnitude of the negative drain to source voltage of RDHEMT 110 will continue to increase until RDHEMT 110 begins to conduct current in the reverse direction from line 107 to reference voltage 106, resulting in a voltage clamping effect on line 107.

The operating characteristics of RDHEMT 110 are also illustrated in FIG. 2 for the case where Vgs=0. When Vgs=0 and Vds is greater than −1.6 volts, there is no current flow through RDHEMT 110. When Vgs=0 and Vds is less than −1.6 volts, there is a reverse current flow through RDHEMT 110. This current flow at the voltage threshold of −1.6 volts is what allows RDHEMT 110 to clamp the voltage on line 107 beginning where the voltage on line 107 is 1.6 volts less than reference voltage −V. For RDHEMT 110, therefore, the voltage threshold of −1.6 volts is referred to herein as the reverse conduction onset voltage, or as the clamping voltage. The voltage at gate 103 and the voltage at gate 113 can be varied to modify the clamping voltage for RDHEMT 110. In general, the clamping voltage will be at the reverse conduction onset voltage.

Figure 4:
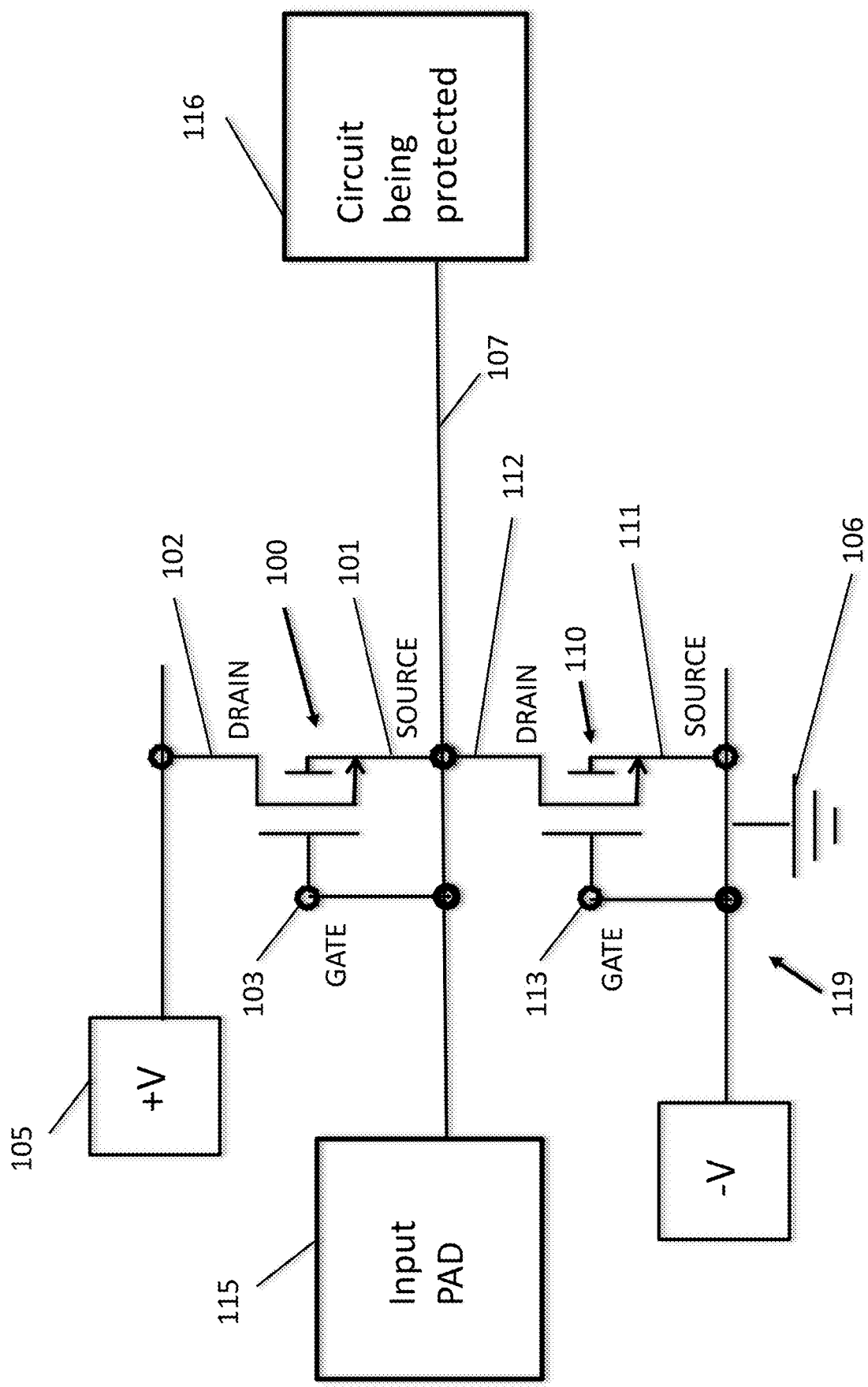
FIG. 4 is a simplified circuit diagram of a voltage clamping circuit providing electrostatic discharge protection for an input pad of an integrated circuit.

FIG. 4 shows voltage clamping circuit 119 used for electrostatic discharge (ESD) protection on an input pad 115 of an integrated circuit 116. When voltage on input pad 115 experiences an ESD or over voltage event, the voltage on input pad 115 can go positive or negative relative to the Gnd (−V) or reference voltage +V. Voltage clamping circuit 119 assures that the voltage does not go too far above reference voltage +V or too far below GND. As discussed above, beginning where the voltage on input pad 115 (and thus line 107) is 1.6 volts more than V+, there is a reverse current flow through RDHEMT 100. This current flow at the reverse conduction onset voltage of −1.6 volts is what allows RDHEMT 100 to clamp the voltage on input pad 115 beginning where the voltage on input pad 115 is 1.6 more than V+. Likewise, beginning where the voltage on input pad 115 is 1.6 volts less than V1 (Gnd), there is a reverse current flow through RDHEMT 110. This current flow at the reverse conduction onset voltage of −1.6 volts is what allows RDHEMT 110 to clamp the voltage on input pad 115 beginning where the voltage on input pad 115 is 1.6 volts less than V−.

Figure 5:
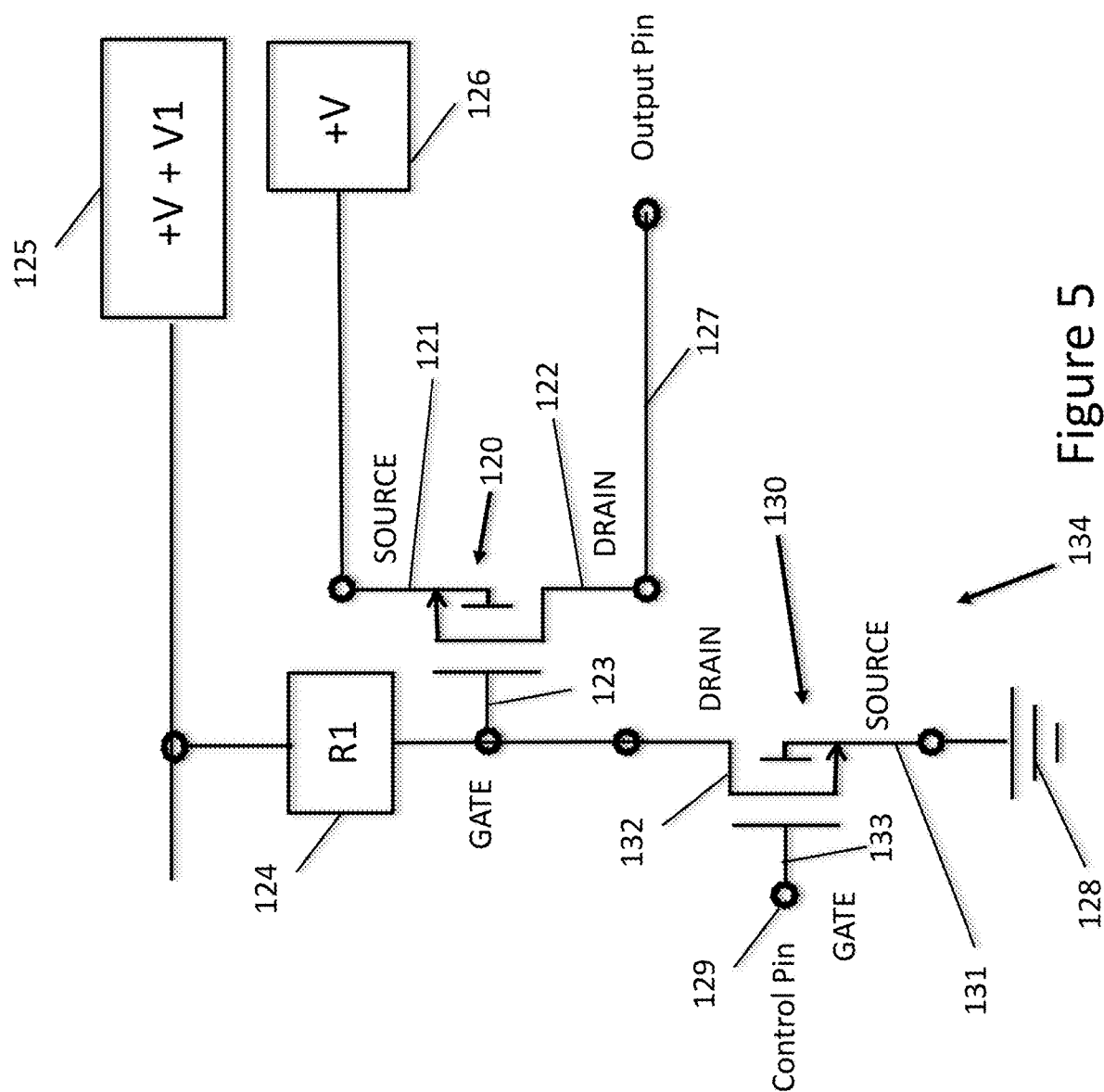
FIG. 5 is a simplified circuit diagram of a high side current source element circuit that provides voltage and current to an output pin of an integrated circuit.

FIG. 5 shows a high side current source element circuit 134 that provides voltage and current to an output pin 127 of an integrated circuit. A current limiting component 124 is, for example, a resistor or depletion mode transistor.

An RDHEMT 120 has a source 121, a drain 122 and a gate 123. A transistor 130 has a source 131, a drain 132 and a gate 133. Source 121 of RDHEMT 120 is connected to a reference voltage 126 (+V). Drain 122 of RDHEMT 120 is connected to output pin 127. Gate 123 of RDHEMT 120 is connected to current limiting component 124.

Source 131 of transistor 130 is connected to a reference voltage 128 (GND). Drain 132 of transistor 130 (+V) is connected to gate 123 of RDHEMT 120. Gate 133 of transistor 130 is connected to current pin input 129 controlled by the integrated circuit.

Current limiting component 124 is connected to a voltage 125, which is more positive than reference voltage 126 (+V) by a value of V1, so that voltage 125 has a value of +V+V1. In general the voltage V1 should be greater than or equal to the reverse conduction onset voltage. When the voltage on gate 123 of RDHEMT 120 is equal to or greater than the reverse conduction onset voltage for RDHEMT 120, RDHEMT 120 will source voltage and current. When voltage V1 is equal to the forward conduction threshold voltage, the output pin 127 will be pulled up to voltage reference voltage +V and the drain to source voltage (Vds) of transistor 140 will be near zero.

The voltage on drain 122 of RDHEMT 120, and thus voltage on output pin 127, is less than or equal to source voltage reference voltage +V which assures RDHEMT 120 is operating in a reverse conduction mode.

RDHEMT 120 will be turned off (i.e., Ids=0) when the gate to source voltage (Vgs) for RDHEMT 120 is sufficiently negative with respect to the drain to source voltage (Vds) for RDHEMT 120, as illustrated in the voltage characteristics for a RDHEMT as shown in FIG. 2.

Transistor 130 is, for example, a HEMT or a MOSFET operating in forward conduction mode. When control pin 129 at gate 133 of transistor 130 is at a voltage level sufficiently above the threshold voltage of transistor 130, transistor 130 will be ON and will pull the voltage on gate 123 of RDHEMT 120 near GND so that RDHEMT 120 will be OFF and output pin 127 will be at a voltage value indicating high impedance or an OPEN circuit. When control pin 129 is at a low voltage value below the threshold voltage of transistor 130, then transistor 130 will be OFF, allowing current limiting component 124 to pull gate 123 of RDHEMT 120 to the voltage value +V+V1 of reference voltage 125.

A significant advantage using a RDHEMT transistor in reverse mode is realized by RDHEMT 120 in FIG. 5 as it does not have saturation characteristic at low gate voltage similar to the forward conduction mode. This is caused by negative charge injected into the channel by the negatively charged Drain electrode. Conduction of the RDHEMT transistor is controlled by both the Vgs voltage and the −Vds voltage. This effect can be seen in FIG. 2.

Figure 6:
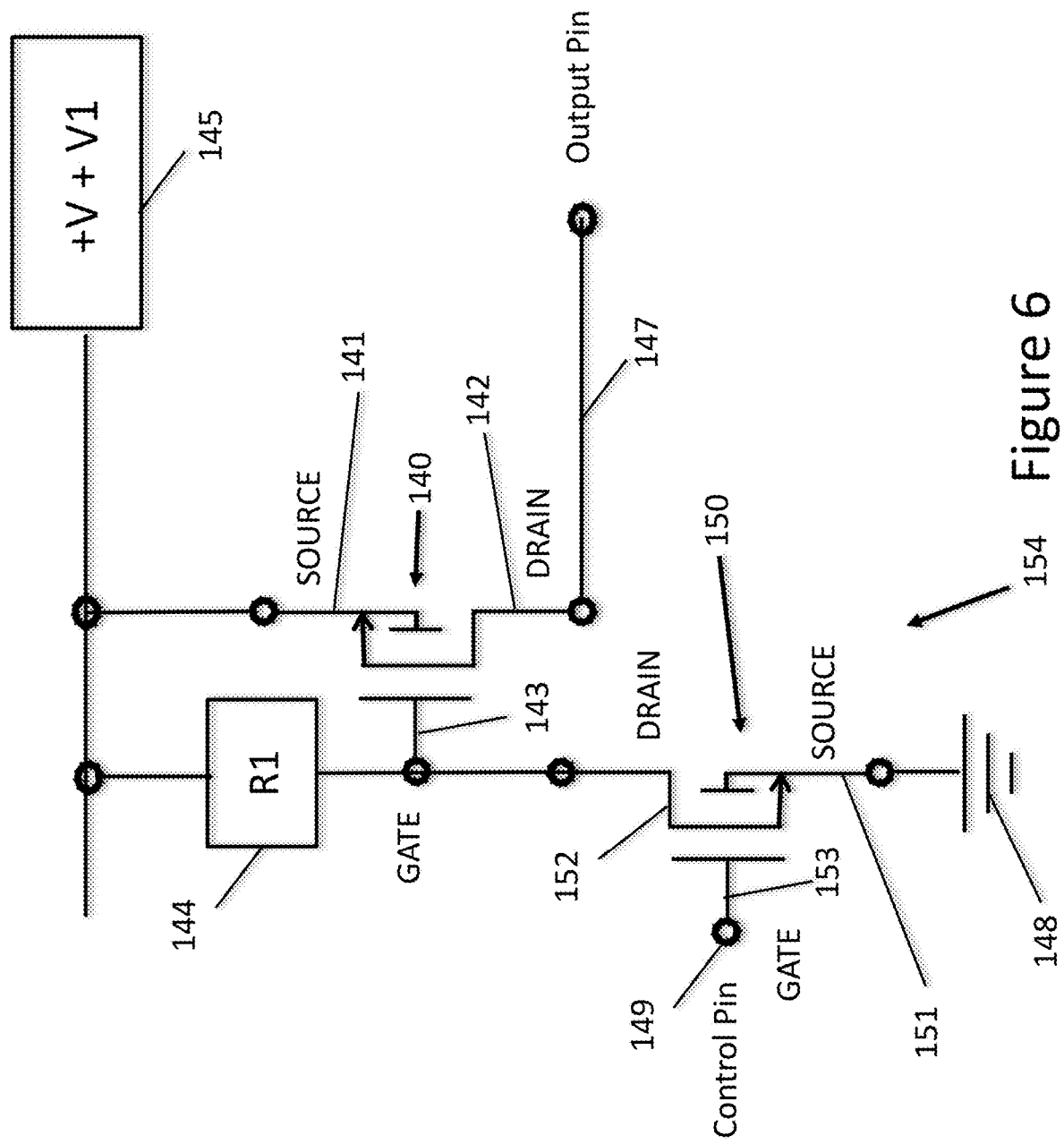
FIG. 6 is a simplified circuit diagram of another high side current source element circuit that provides voltage and current to an output pin of an integrated circuit.

FIG. 6 shows a high side current source element circuit 154 that provides voltage and current to an output pin 147 of an integrated circuit. A current limiting component 144 is, for example, a resistor or depletion mode transistor.

An RDHEMT 140 has a source 141, a drain 142 and a gate 143. A transistor 150 has a source 151, a drain 152 and a gate 153. Source 141 of RDHEMT 140 is connected to a positive voltage supply reference voltage 145 (+V +V1). Drain 142 of RDHEMT 140 is connected to output pin 147. Gate 143 of RDHEMT 140 is connected to current limiting component 144.

Source 151 of transistor 150 is connected to a reference voltage 148 (GND). Drain 152 of transistor 150 (+V) is connected to gate 143 of RDHEMT 140. Gate 153 of transistor 150 is connected to current pin input 149 controlled by the integrated circuit.

When the voltage on the gate of RDHEMT 140 is allowed to be pulled up to voltage supply reference voltage 145 (+V+V1), RDHEMT 140, will source voltage and current such that the voltage at output pin 147 will be pulled up to voltage (+V+V1)−Vrco, where Vrco is the reverse conduction onset voltage of RDHEMT 140. The voltage on drain 142 of RDHEMT 140, at output pin 147, will be less than or equal to voltage supply reference voltage 145 (+V+V1), which assures RDHEMT 140 is operating in the reverse conduction mode.

RDHEMT 140 will be OFF if the gate to source voltage (Vgs) of RDHEMT 140 is sufficiently negative with respect to the drain to source voltage (Vds) of RDHEMT 140 as illustrated in the voltage characteristics shown in FIG. 2.

For example, transistor 150 is a HEMT or MOS transistor operated in forward conduction mode. When voltage on control pin 149, at gate 153 of transistor 150, is at a voltage value sufficiently above the threshold voltage of transistor 150, transistor 150 will be ON and transistor 150 will pull the voltage on gate 143 of RDHEMT 140 near GND 148 so that RDHEMT 140 will be OFF and output pin 147 will be at a value indicating high impedance or OPEN circuit. When the control pin 149 is at a low voltage below the threshold voltage of transistor 150, then transistor 150 will be OFF allowing current limiting component 144 to pull gate 143 of RDHEMT 140 to voltage supply reference voltage 145 (+V+V1).

High side current source element circuit 134 shown in FIG. 5 and high side current source element circuit 154 shown FIG. 6 can be used to replace circuits typically implemented using a p-channel transistor in CMOS logic circuits. This allows creation of a new class of devices implemented in RDHEMT process technology that eliminates the need to increase fabrication cost and complexity by integrating enhancement mode (p-channel) devices which turn on with a negative voltage relative to the source.

Figure 7:
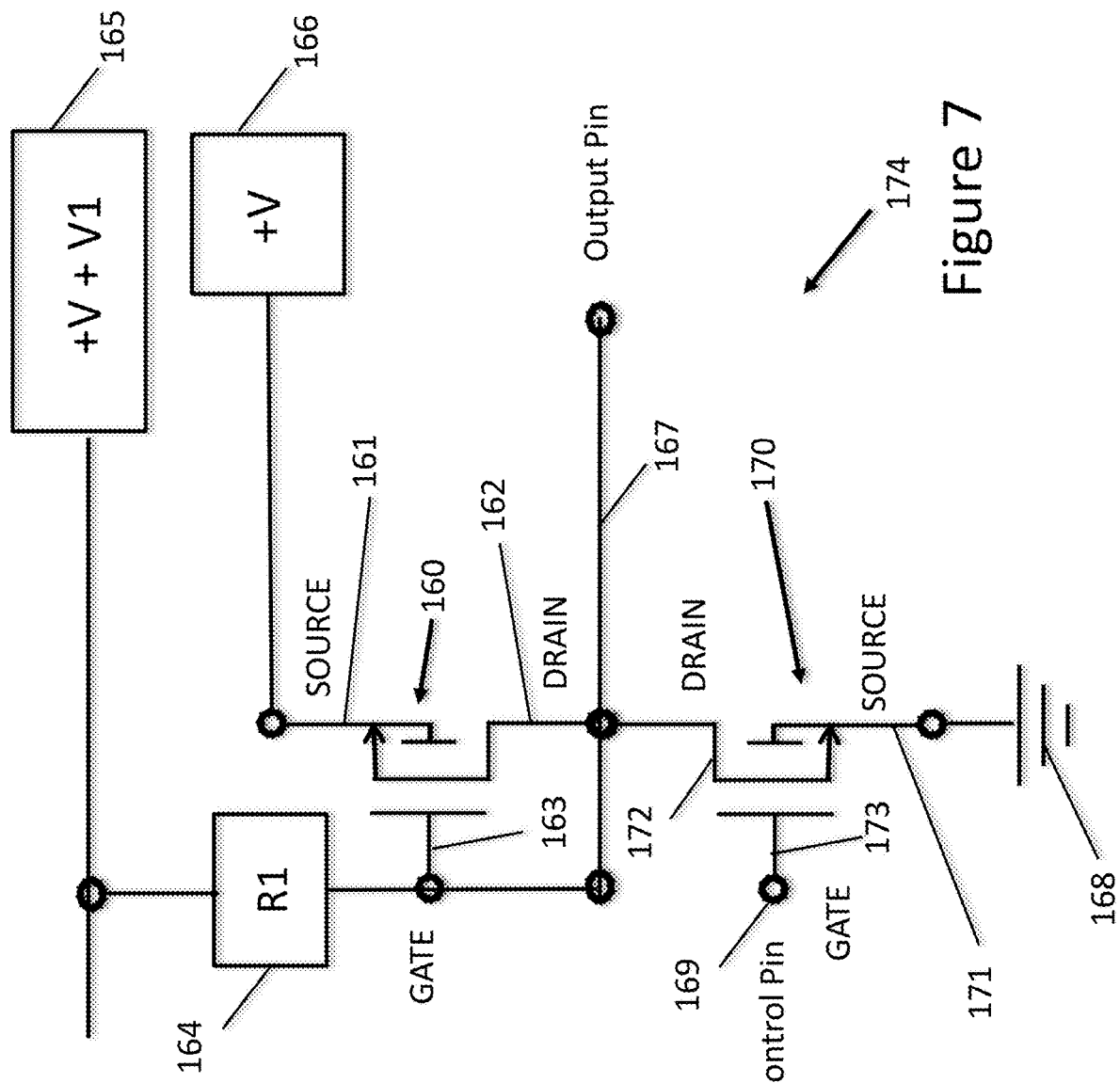
FIG. 7 is a simplified circuit diagram of an inverter circuit.

FIG. 7 shows an inverter circuit 174 that can be used to implement an inverter, an inverting buffer or a reverse direction high-electron (RDHE) inverter. A current limiting component 164 is, for example, a resistor or depletion mode transistor.

An RDHEMT 160 has a source 161, a drain 162 and a gate 163. A transistor 170 has a source 171, a drain 172 and a gate 173. Source 161 of RDHEMT 160 is connected to a reference voltage 166 (+V). Drain 162 of RDHEMT 160 is connected to an output pin 167, to drain 172 of RDHEMT 170 and to current limiting component 164.

Source 171 of transistor 170 is connected to a reference voltage 168 (GND). Drain 172 of transistor 170 is connected to output pin 167, to drain 162 of RDHEMT 160 and to current limiting component 164. Gate 173 of transistor 170 is connected to control pin input 169 controlled by the integrated circuit. Current limiting component 164 is connected between output pin 167 and reference voltage 165 (+V+V1).

For example, transistor 170 is a HEMT. When control pin 169 at gate 173 of gate transistor 170 is switched from LOW to HIGH sufficiently so that the voltage at gate 173 is above the threshold voltage of transistor 170, transistor 170 will turn ON. RDHEMT 160 will have been turned ON in low conduction mode, so output pin 167 will be pulled low to GND by transistor 170. This will pull gate 163 of RDHEMT 160 low to GND as the resistance of current limiting component 164 and RDHEMT 160 in low conduction mode is sufficiently higher than transistor 170 during this transition. The drain to source voltage (Vds) of RDHEMT 160 will be equal to −I+V I. With a −Vgs voltage of −I+V I, RDHEMT 160 is turned off.

When the voltage on control pin 169 at gate 173 of gate transistor 170 is switched from high to low (GND), transistor 170 is turned OFF. RDHEMT 160 has a negative Vds of −I+V I so it is in high conduction mode. When transistor 170 turns off, current limiting component 164 will pull gate 163 of RDHEMT 160 to +V+V1 and the increase in gate voltage at gate 163 will cause RDHEMT 160 to conduct in the reverse direction. The absolute value of the negative voltage on −Vds will decrease and the output will be pulled to +V and RDHEMT 160 will be in low conduction mode as illustrated by the voltage characteristics shown in FIG. 2.

At the start of the switching process when the voltage on output pin 167 shifts from output high to output low, RDHEMT 160 will be in a low conduction state with Vds=0, so the current shoot through RDHEMT 160 will be minimized when the voltage value on control pin 169 goes high and thus turns on HEMT transistor 170.

The inverter shown in FIG. 7 can be used as the basis to form logic gates that are a significant improvement over logic gates formed using complementary metal-oxide-silicon (CMOS) technology.

Figure 8:
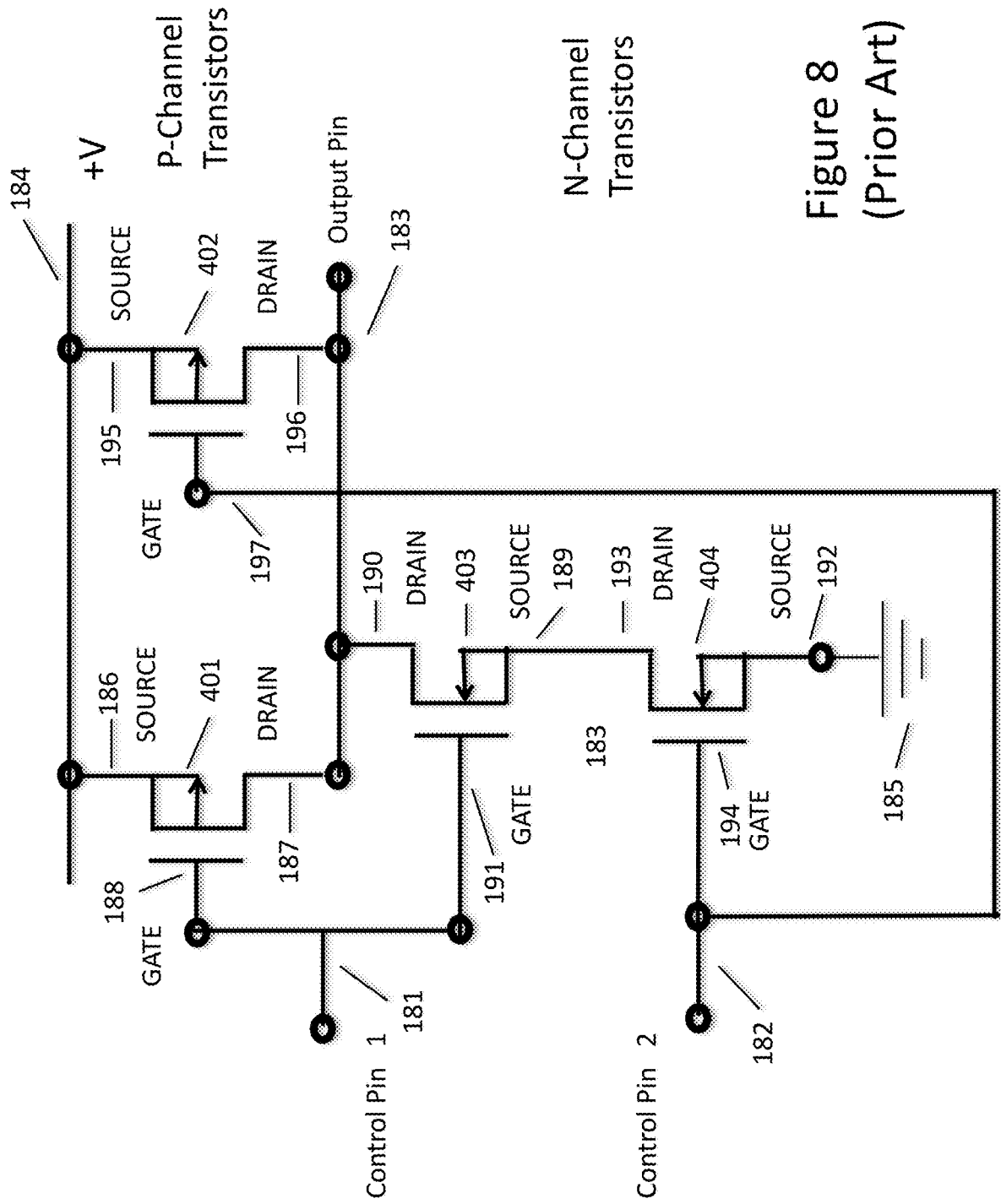
FIG. 8 shows a prior art CMOS NAND logic gate.

For example, FIG. 8 shows a prior art CMOS NAND logic gate. The CMOS NAND logic gate uses two p-channel transistors connected in parallel and two n-channel transistors connected in series to perform a logical NAND of values on a control pin 181 and a control pin 182 to produce an output value on output pin 183.

A p-channel transistor 401 includes a source 186 connected to a reference voltage 184 (+V), a drain 187 connected to output pin 183 and a gate 188 connected to control pin 181. A p-channel transistor 402 includes a source 195 connected to reference voltage 184 (+V), a drain 196 connected to output pin 183 and a gate 197 connected to control pin 182.

An n-channel transistor 403 includes a source 189, a drain 190 connected to output pin 183 and a gate 191 connected to control pin 181. A p-channel transistor 404 includes a source 192 connected to a ground reference voltage 185, a drain 193 connected to source 189 of n-channel transistor 403 and a gate 194 connected to control pin 182.

In the NAND logic gate shown in FIG. 8, p-channel transistor 401 and p-channel 402 function as current sourcing transistors and n-channel transistor 403 and n-channel 404 function as current sinking transistors. To pull output pin 183 high, either of the current sourcing transistors can be on while the current sinking transistors are off. To achieve a low output on output pin 183, both current sinking transistors must be on while both current sourcing transistors are off.

While four transistors are required to implement a NAND logic gate in CMOS technology, only three transistors are necessary when using an RDHEMT based on the inverter circuit shown in FIG. 7.

Figure 9:
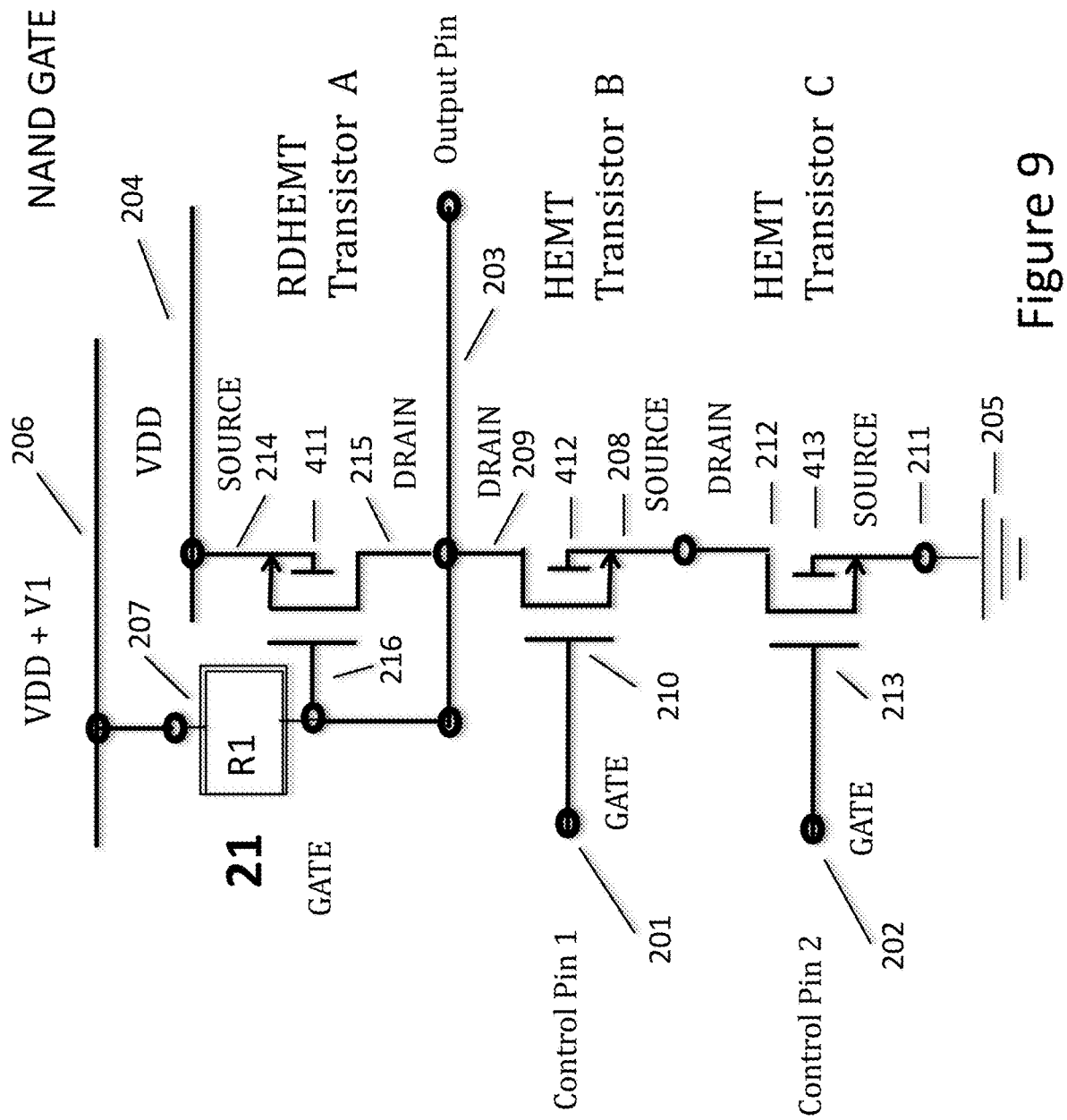
FIG. 9 shows a NAND logic gate implemented using an RDHEMT.

For example, FIG. 9 shows a NAND logic gate implemented using an RDHEMT 411. RDHEMT 411 includes a source 204 connected to a reference voltage 204 (VDD), a drain 215 connected to an output pin 203 and a gate 216 connected to output pin 203.

An HEMT 412 includes a source 208, a drain 209 connected to output pin 203 and a gate 210 connected to control pin 201. An HEMT 413 includes a source 211 connected to a ground reference voltage 205, a drain 212 connected to source 208 of HEMT 412 and a gate 213 connected to control pin 202. A resistance 207 is connected between output pin 203 and a reference voltage 206 (VDD+V1). For example, resistance 207 is implemented using a resistor or a depletion mode transistor.

In the NAND logic gate shown in FIG. 9, HEMT 412 and HEMT 413 function as logic implementing circuitry.

In the NAND logic gate shown in FIG. 9, a single RDHEMT 411 replaces the two current sourcing transistors required for the prior art design shown in FIG. 8. This reduction in the required number of transistors to implement a logic gate is a significant improvement over the prior art.

For the NAND logic gate shown in FIG. 9, when control pin 201 and control pin 202 are HIGH, output pin 203 is pulled LOW by HEMT 412 and HEMT 413, which are ON and RDHEMT 411. When control pin 201 and control pin 202 are LOW, HEMT 412 and HEMT 413 are OFF and RDHEMT 411 is ON, gate 216 of RDHEMT 411 is pulled to VDD+V1, and the output pin 203 is pulled HIGH to VDD 204.

In general, as RDHEMT transistors turn on when the drain is negative with respect to their source voltage, their on/off conduction can be modulated by the output pin as opposed to gate control as in p-channel current sources of CMOS logic. The gate-to-source voltage of a RDHEMT can modulate the amount of negative drain to source voltage required for conduction to begin.

On the other hand, a p-channel transistor in conventional CMOS logic is fully ON when the drain or output is pulled to the +V rail. If a low side current source were to be turned on to attempt to pull the output low while the p-channel transistor is ON, a large current flow from power to ground would result.

When used as a high side current source as seen in FIG. 5, the RDHEMT turns off when the drain is pulled high to the +V rail and the negative drain to source potential is insufficient to initiate conduction, the RDHEMT is OFF which allows for output switching control as seen in FIG. 6.

Figure 10:
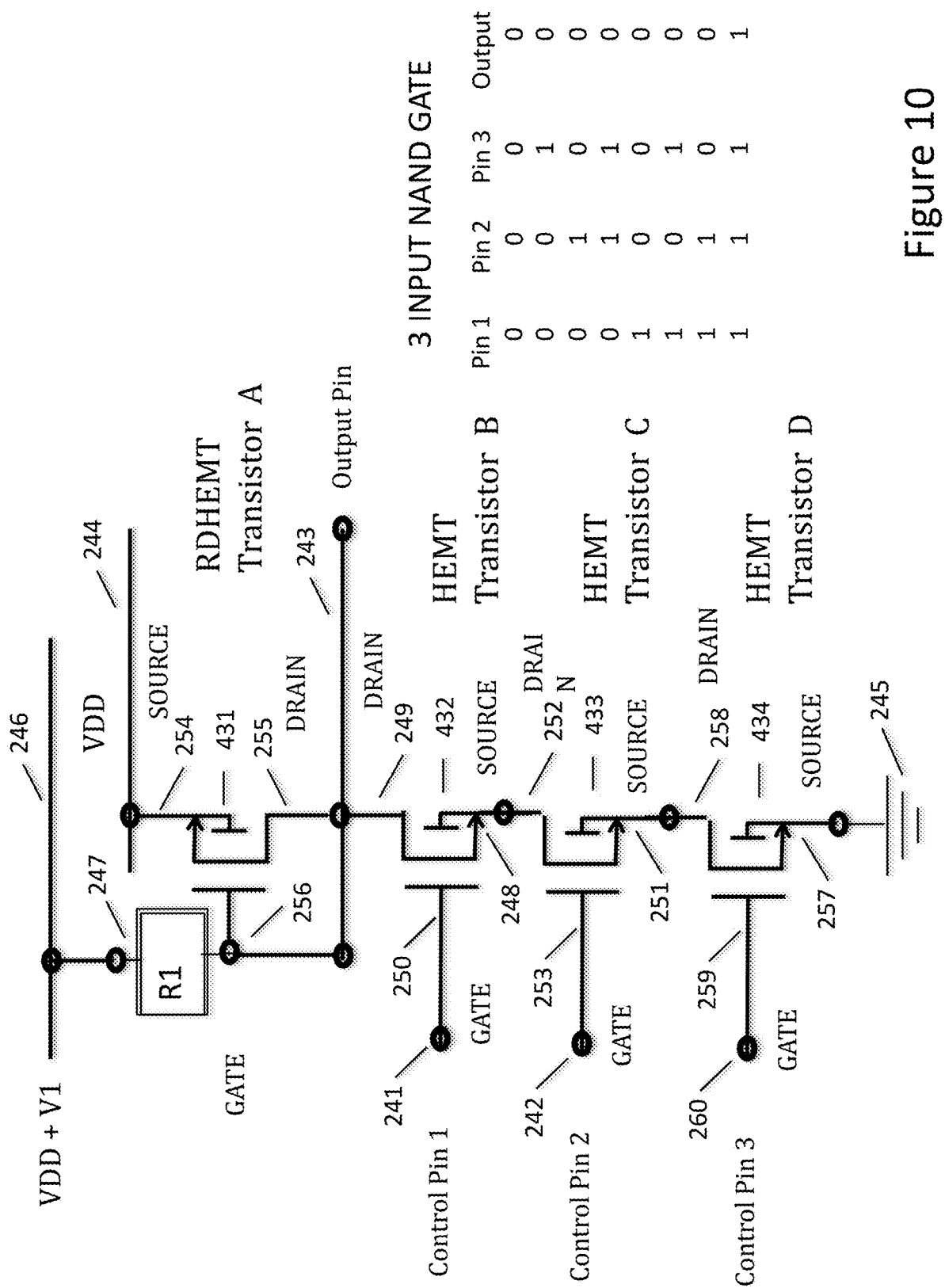
FIG. 10 shows a three input NAND logic gate implemented using an RDHEMT.

A similar reduction in transistors can also be obtained when implementing other logic circuitry. For example, only four transistors are required to implement a three input NAND logic gate when using an RDHEMT. For example, FIG. 10 shows a NAND logic gate implemented using an RDHEMT 431. RDHEMT 431 includes a source 254 connected to a reference voltage 244 (VDD), a drain 255 connected to an output pin 243 and a gate 256 connected to output pin 243.

An HEMT 432 includes a source 248, a drain 249 connected to output pin 253 and a gate 240 connected to control pin 241. An HEMT 433 includes a source 251, a drain 252 connected to source 248 of HEMT 432 and a gate 253 connected to control pin 242. An HEMT 434 includes a source 257 connected to a ground reference voltage 245, a drain 258 connected to source 251 of HEMT 433 and a gate 259 connected to control pin 260. A resistance 247 is connected between output pin 243 and a reference voltage 246 (VDD+V1). For example, resistance 247 is implemented using a resistor or a depletion mode transistor.

In the NAND logic gate shown in FIG. 10, a single RDHEMT 441 replaces the two current sourcing transistors required for the prior art design. This reduction in the required number of transistors to implement a logic gate is a significant improvement over the prior art.

In the NAND logic gate shown in FIG. 10, HEMT 432, HEMT 433 and HEMT 434 function as logic implementing circuitry. Additional HEMTs with gates attached to additional inputs can be added in series with HEMT 432, HEMT 433 and HEMT 434 to increase the number of inputs to the logic NAND gate.

Figure 11:
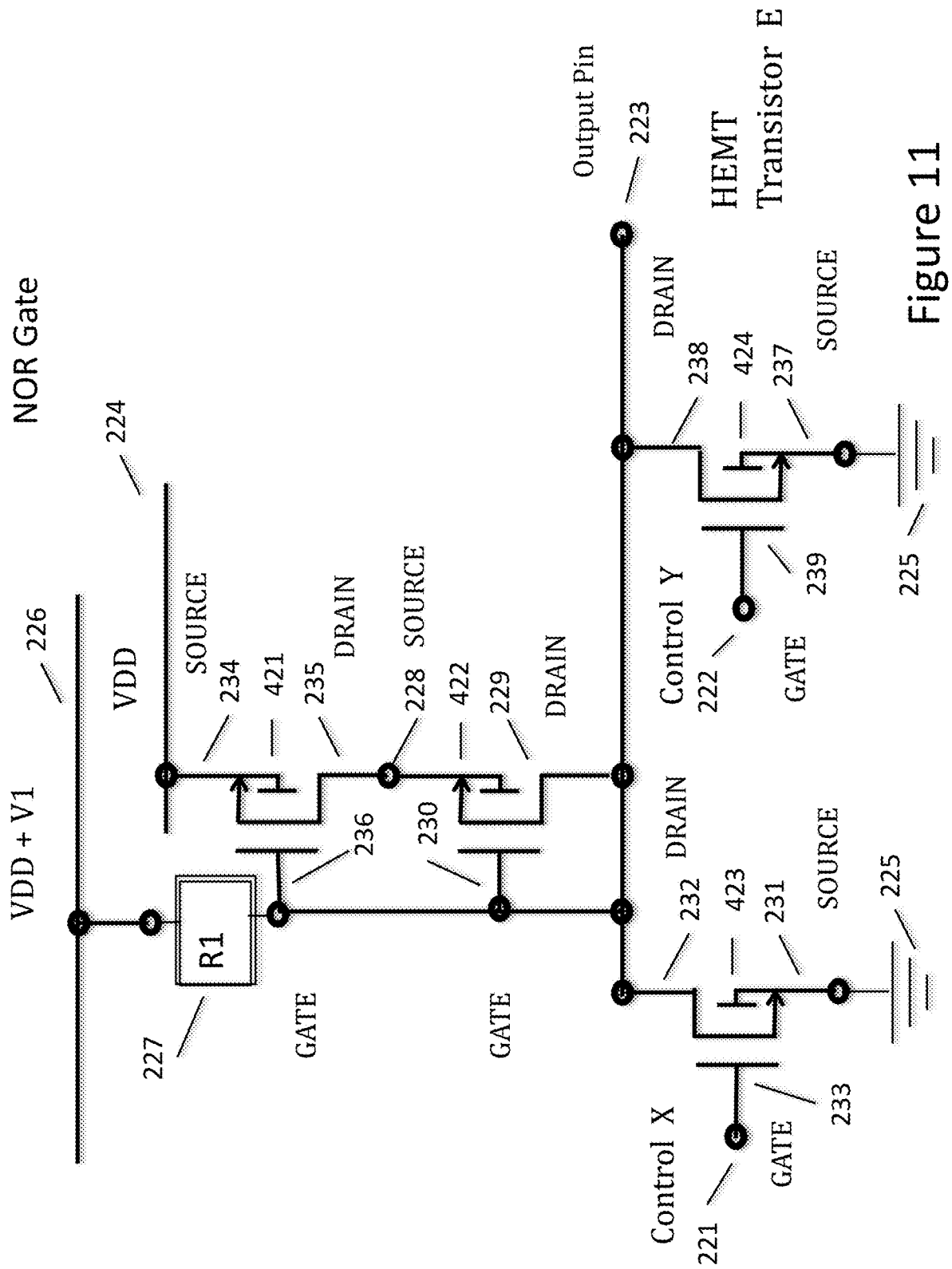
FIG. 11 shows a NOR logic gate implemented using two RDHEMTs.

FIG. 11 shows a NOR logic gate implemented using an RDHEMT 421 and an RDHEMT 422. RDHEMT 421 includes a source 234 connected to a reference voltage 224 (VDD), a drain 235 and a gate 236 connected to an output pin 213. RDHEMT 422 includes a source 228 connected to a drain 235 of RDHEMT 421, a drain 229 connected to output pin 213 and a gate 230 connected to output pin 213.

An HEMT 423 includes a source 231 connected to a ground reference voltage 225, a drain 232 connected to output pin 223 and a gate 233 connected to control pin 221. An HEMT 424 includes a source 237 connected to ground reference voltage 225, a drain 238 connected to output pin 223 and a gate 239 connected to control pin 222. A resistance 227 is connected between output pin 223 and a reference voltage 226 (VDD+V1). For example, resistance 227 is implemented using a resistor or a depletion mode transistor.

For the NOR logic gate shown in FIG. 11, if control pin 221 OR control pin 222 are HIGH, output pin 223 is pulled LOW with RDHEMT 421 and RDHEMT 422 OFF. If both control pin 221 and control pin 222 are LOW, HEMT 423 and HEMT 424 are OFF, RDHEMT 421 and RDHEMT 422 are ON with their gates pulled to VDD+V1 by resistance 227, and output pin 223 is HIGH.

In the NOR logic gate shown in FIG. 11, HEMT 423 and HEMT 424 function as logic implementing circuitry. Additional HEMTs with gates attached to additional inputs can be added in parallel with HEMT 423 and HEMT 424 to increase the number of inputs to the logic NOR gate.

Figure 12:
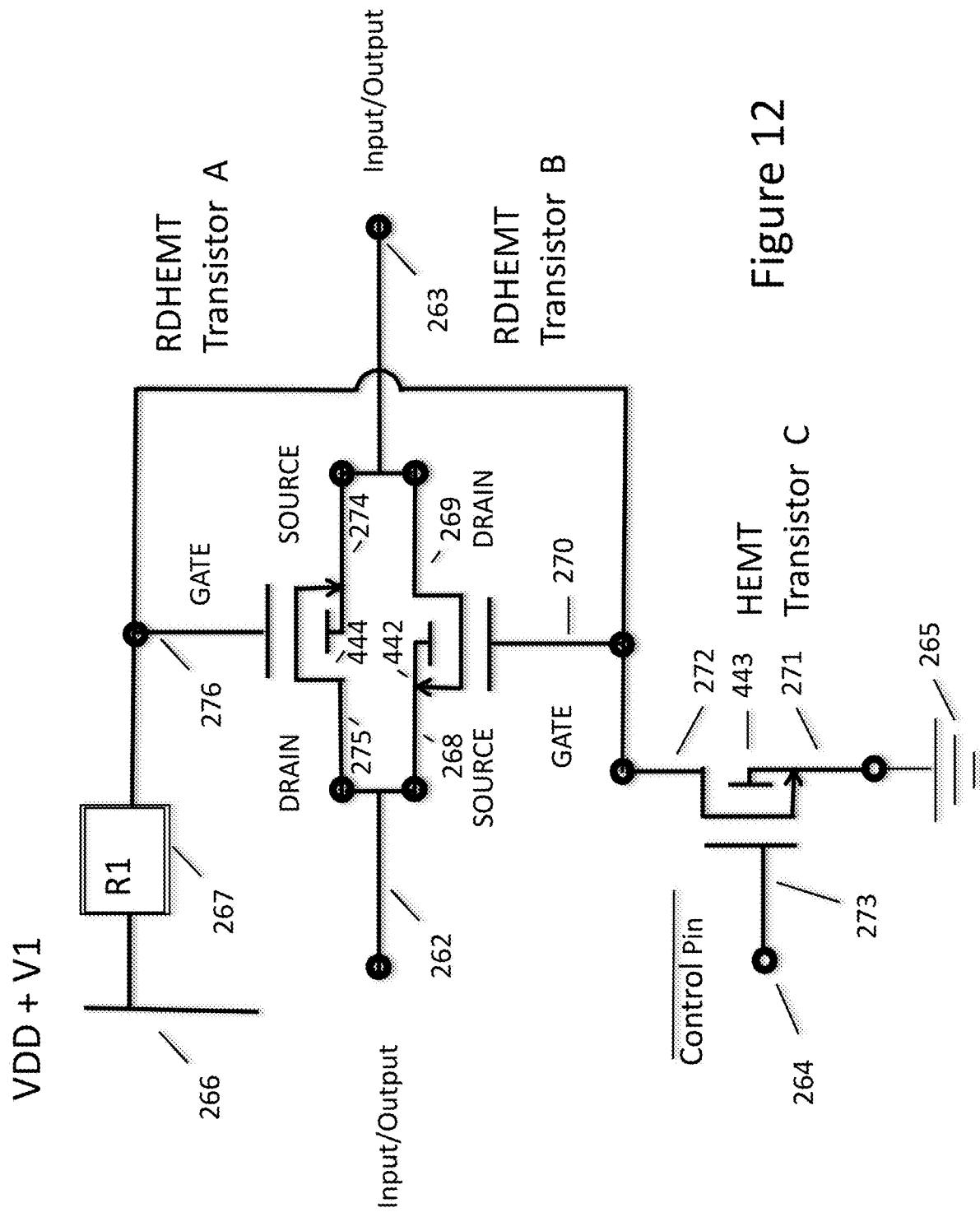
FIG. 12 shows implementation of a transmission circuit utilizing two RDHEMTs.

FIG. 12 shows implementation of a transmission circuit utilizing an RDHEMT 441 and RDHEMT 442. RDHEMT 441 includes a source 274 connected to an input/output pin 263, a drain 275 to input/output pin 263 and a gate 276. RDHEMT 442 includes a source 268 connected to input/output pin 263, a drain 269 to input/output pin 263 and a gate 270 connected to gate 276 of RDHEMT 441.

An HEMT 443 includes a source 271 connected to a ground reference voltage 265, a drain 272 connected to gate 276 of RDHEMT 441 and a gate 273 connected to control pin 264. A resistance 267 is connected between gate 276 of RDHEMT 441 and a reference voltage 266 (VDD+V1). For example, resistance 267 is implemented using a resistor or a depletion mode transistor.

The gates of both RDHEMT 441 and RDHEMT 442 are connected to resistance 267. For example, resistance 267 is implemented using a resistor or a depletion mode transistor. HEMT transistor 443 is used to control the gate voltage on transistors RDHEMT 441 and RDHEMT 442 such that when control pin 264 is high, transistor HEMT transistor 443 on and the gates of RDHEMT 441 and RDHEMT 442 will be pulled to GND and are OFF. When control pin 264 is LOW the gates of RDHEMT 441 and RDHEMT 442 will be pulled high by resistance 267 to VDD+V1 and be ON such that one of RDHEMT 441 and RDHEMT 442 is conducting in forward mode and the other of RDHEMT 441 and RDHEMT 442 will be conducting in reverse mode depending on the polarity of the Input/output voltage.

Figure 13:
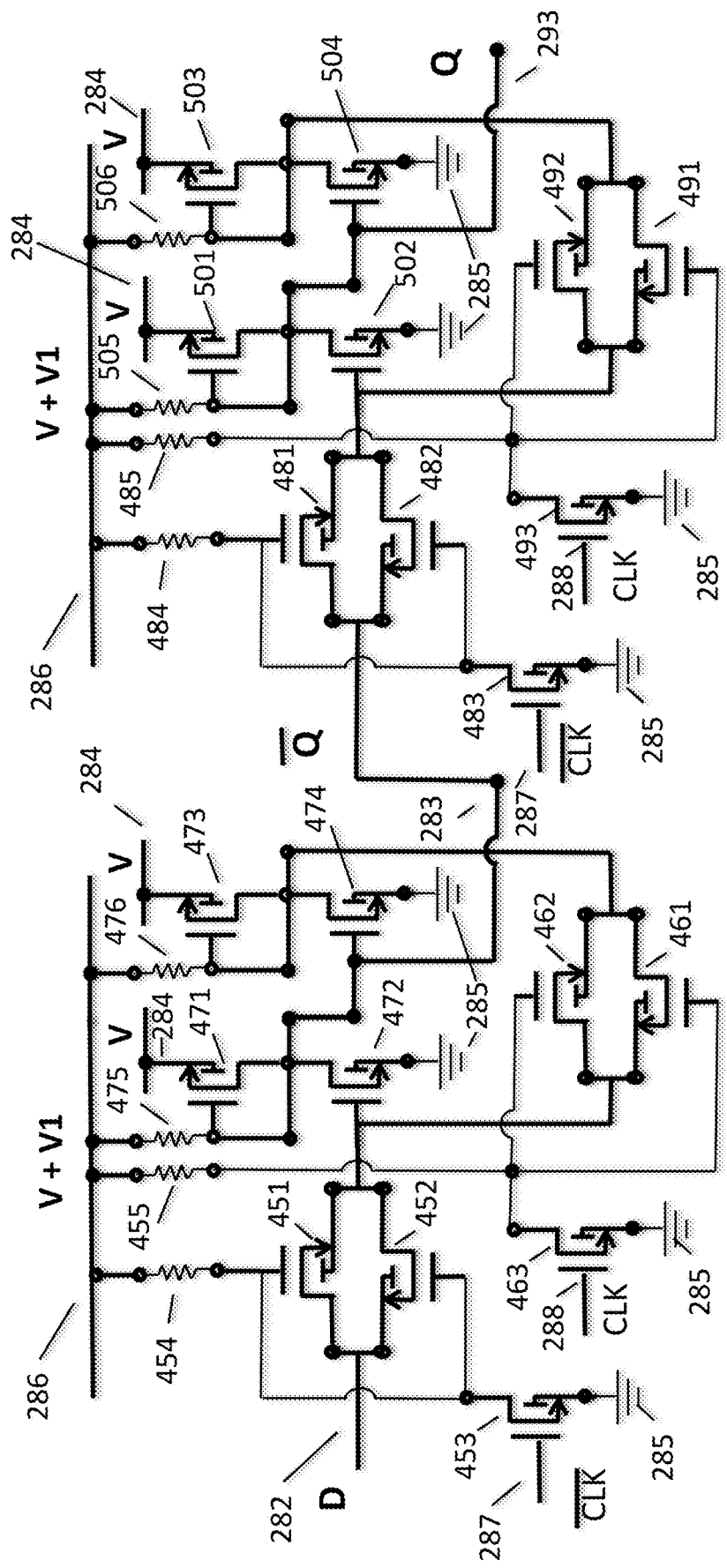
FIG. 13 shows implementation of a master-slave flip-flop utilizing RDHEMTs.

The transmission circuit shown in FIG. 12 and the inverter shown in FIG. 7 can be used to implement a master-slave flip-flop as shown in FIG. 13. A first flip-flop has an D input 282, an inverse clock input 287, a clock input 288 and an inverse Q input 283.

For the first flip-flop, a first transmission circuit is implemented using an RDHEMT 451, an RDHEMT 452, an HEMT 453, and a resistance 454, connected as shown in FIG. 13 to inverse clock input 287, D input 282, a reference voltage 286 (V+V1) and a ground reference 285.

A second transmission circuit of the first flip-flop is implemented using an RDHEMT 461, an RDHEMT 462, an HEMT 463, and a resistance 455 connected as shown in FIG. 13 to clock input 288, reference voltage 286 (V+V1) and ground reference 285.

A first inverter circuit of the first flip-flop is implemented using an RDHEMT 471, an HEMT 472, and a resistance 475, connected as shown in FIG. 13 to reference voltage 286 (V+V1), a reference voltage 284 (V), and ground reference 285.

A second inverter circuit of the first flip-flop is implemented using an RDHEMT 473, an HEMT 474, and a resistance 476, connected as shown in FIG. 13 to reference voltage 286 (V+V1), reference voltage 284 (V), and ground reference 285.

For the second flip-flop, a first transmission circuit is implemented using an RDHEMT 481, an RDHEMT 482, an HEMT 483, and a resistance 484, connected as shown in FIG. 13 to inverse clock input 287, inverse Q output 283, reference voltage 286 (V+V1) and ground reference 285.

A second transmission circuit of the second flip-flop is implemented using an RDHEMT 491, an RDHEMT 492, an HEMT 493, and a resistance 485 connected as shown in FIG. 13 to clock input 288, reference voltage 286 (V+V1) and ground reference 285.

A first inverter circuit of the second flip-flop is implemented using an RDHEMT 501, an HEMT 502, and a resistance 505, connected as shown in FIG. 13 to reference voltage 286 (V+V1), reference voltage 284 (V), and ground reference 285.

A second inverter circuit of the second flip-flop is implemented using an RDHEMT 503, an HEMT 504, and a resistance 506, connected as shown in FIG. 13 to reference voltage 286 (V+V1), reference voltage 284 (V), and ground reference 285.

Figure 14:
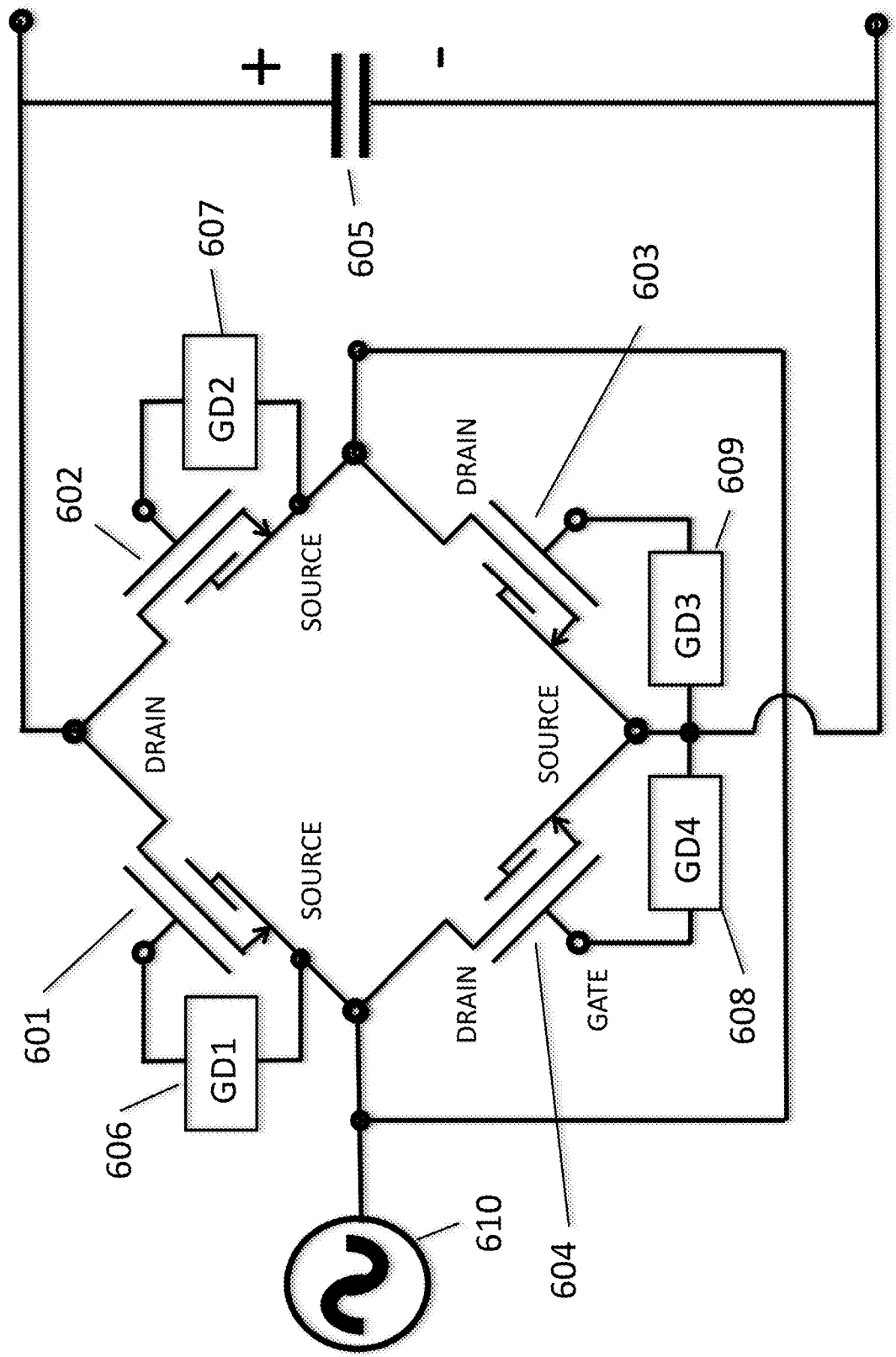
FIG. 14 implementation of a bridge circuit utilizing RDHEMTs.

FIG. 14 is a bridge circuit utilizing an RDHEMT 601, RDHEMT 602, RDHEMT 603 and an RDHEMT 604, which each conduct voltage and current in the reverse direction.

When an AC input signal 610 is applied to RDHEMT 601 and RDHEMT 602, and the voltage of the AC input signal is above the positive voltage of a capacitor 605 by its threshold voltage, then RDHEMT 601 and RDHEMT 602 will conduct current in the reverse direction charging capacitor 47. If desired an additional circuit component 606 and additional circuit component 607 can be used to apply a positive voltage to RDHEMT 601 and RDHEMT 602 relative to their source voltage to decrease the voltage drop across the RDHEMTs.

When AC input signal 610 is applied to RDHEMT 604 and RDHEMT 603, and the voltage of the AC input signal is less than the negative voltage of capacitor 47 by their threshold voltage, then RDHEMT 604 and RDHEMT 603 will conduct current in the reverse direction. If desired an additional circuit component 608 and additional circuit component 609 can be used to apply a positive voltage to RDHEMT 604 and RDHEMT 603 relative to their source voltage to decrease the voltage drop across the RDHEMTs.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A logic NAND gate comprising:
   a first input;
   a second input;
   an output;
   a first reference voltage;
   a second reference voltage, the second reference voltage having a higher voltage value that the first voltage reference;
   a third reference, the third reference voltage having a lower voltage value that the first voltage reference;
   a reverse direction high-electron-mobility transistor, the reverse direction high-electron-mobility transistor including:
      a source connected to the first reference voltage,
      a gate connected to the output, and
      a drain connected to the output; and
   logic implementing circuitry connected between the output and the third reference voltage, the logic implementing circuitry including:
      a first transistor and a second transistor connected in series;
   wherein a gate of the first transistor is connected to the first input; and,
   wherein a gate of the second transistor is connected to the second input.

2. A logic NAND gate as in claim 1, additionally comprising:
   a third input;
   wherein the logic implementing circuitry additionally includes a third transistor connected in series with the first transistor and the second transistor, wherein a gate of the third transistor is connected to the third input.

3. A logic NAND gate as in claim 2:
wherein the third transistor is a high-electron-mobility transistor having a source connected to the third reference voltage and having a drain;
wherein the second transistor is a high-electron-mobility transistor having a source connected to the drain of the third transistor and having a drain; and
wherein the first transistor is a high-electron-mobility transistor having a source connected to the drain of the second transistor and having a drain connected to the output pin.

4. A logic NAND gate as in claim 3, additionally comprising:
a resistance connected between the first reference voltage and the second reference voltage.

5. A logic NAND gate as in claim 1:
wherein the second transistor is a high-electron-mobility transistor having a source connected to the third reference voltage and having a drain; and
wherein the first transistor is a high-electron-mobility transistor having a source connected to the drain of the second transistor and having a drain connected to the output pin.

6. A logic NAND gate as in claim 1, additionally comprising:
a resistance connected between the first reference voltage and the second reference voltage.

7. A logic gate comprising:
a first input;
a second input;
an output;
a first reference voltage;
a second reference voltage, the second reference voltage having a higher voltage value that the first voltage reference;
a third reference, the third reference voltage having a lower voltage value that the first voltage reference;
at least one reverse direction high-electron-mobility transistor, the reverse direction high-electron-mobility transistor including:
at least one source connected to the first reference voltage,
at least one gate connected to the output, and
at least one drain connected to the output; and
logic implementing circuitry connected between the output and the third reference voltage, the logic implementing circuitry including:
a first transistor that includes a gate connected to the first input, and
a second transistor that includes a gate connected to the second input.

8. A logic gate as in claim 7:
wherein the at least one reverse direction high-electron-mobility transistor includes:
a first high-electron-mobility transistor having a gate connected to the output pin, a source connected to the first reference voltage and a drain, and
a second high-electron-mobility transistor having a gate connected to the output pin, a source connected to the drain of the first high-electron-mobility transistor and a drain connected to the output pin.

9. A logic gate as in claim 8:
wherein the first transistor is a high-electron-mobility transistor with a drain connected to the output and a source connected to the third reference voltage; and
wherein the second transistor is a high-electron-mobility transistor with a drain connected to the output and a source connected to the third reference voltage.

10. A logic gate as in claim 9, additionally comprising:
a resistance connected between the first reference voltage and the second reference voltage.

11. A logic gate as in claim 7:
wherein the first transistor is a high-electron-mobility transistor with a drain connected to the output and a source connected to the third reference voltage; and
wherein the second transistor is a high-electron-mobility transistor with a drain connected to the output and a source connected to the third reference voltage.

12. A logic gate as in claim 7:
wherein the first transistor is a high-electron-mobility transistor with a drain connected to the output and a source; and
wherein the second transistor is a high-electron-mobility transistor with a drain connected to the source of the first transistor and a source connected to the third reference voltage.

13. A logic gate as in claim 7:
wherein the logic implementing circuitry additionally includes a third transistor that includes a gate connected to a third input of the logic gate;
wherein the first transistor is a high-electron-mobility transistor with a drain connected to the output and a source;
wherein the second transistor is a high-electron-mobility transistor with a drain connected to the source of the first transistor and a source; and
wherein the third transistor is a high-electron-mobility transistor with a drain connected to the source of the second transistor and a source connected to the third reference voltage.

14. A logic gate as in claim 7, additionally comprising:
a resistance connected between the first reference voltage and the second reference voltage.

15. A logic transmission gate comprising:
a first input/output;
a second input/output;
a control input;
a first reference voltage;
a second reference voltage, the second reference voltage having a lower voltage value that the first voltage reference;
a first reverse direction high-electron-mobility transistor, including:
a source connected to the first input/output,
a drain connected to the second input/output, and
a gate;
a second reverse direction high-electron-mobility transistor, including:
a drain connected to the first input/output,
a source connected to the second input/output, and
a gate connected to the gate of the first reverse direction high-electron-mobility transistor;
a transistor, including:
a gate connected to the control input,
a drain connected to the gate of the first reverse direction high-electron-mobility transistor, and
a source connected to the second reference voltage; and
a resistance connected between the gate of the first reverse direction high-electron-mobility transistor and the first reference voltage.

16. A logic transmission gate as sin claim 15, wherein the resistance is a resistor or a depletion mode transistor.

17. A logic transmission gate as sin claim 15, wherein the transistor is a high-electron-mobility transistor.

\* \* \* \* \*